United States Patent [19]
Crane et al.

[11] Patent Number: 6,164,797
[45] Date of Patent: Dec. 26, 2000

[54] END MOUNT BALLAST- SOCKET BRIDGE

[75] Inventors: Roy B. Crane, Wilmington, Mass.; Paul T. Metcalf, II, Danville; William C. Fabbri, Barnstead, both of N.H.

[73] Assignee: Genlyte Thomas Group LLC, Louisville, Ky.

[21] Appl. No.: 09/135,156

[22] Filed: Aug. 17, 1998

[51] Int. Cl.[7] .................................................. F21V 23/02
[52] U.S. Cl. .................. 362/221; 362/225; 362/260; 362/365; 361/674
[58] Field of Search .................................. 362/221, 225, 362/260, 216, 365, 147, 249, 265, 240, 263, 283; 315/56, 209; 361/674; 174/DIG. 2

[56] References Cited

U.S. PATENT DOCUMENTS

| 4,969,070 | 11/1990 | Costa ....................................... 362/221 |
| 5,720,546 | 2/1998 | Correll, Jr. et al. ..................... 362/221 |

*Primary Examiner*—Stephen Husar
*Assistant Examiner*—Bertrand Zeade

[57] ABSTRACT

A fluorescent lighting fixture utilizing a printed circuit board as an electronic ballast. The printed circuit board ballast includes outlet pins which are directly mounted and connected to the lampholders, thereby to minimize or eliminate a number of wires running between the ballast and lampholders.

5 Claims, 3 Drawing Sheets

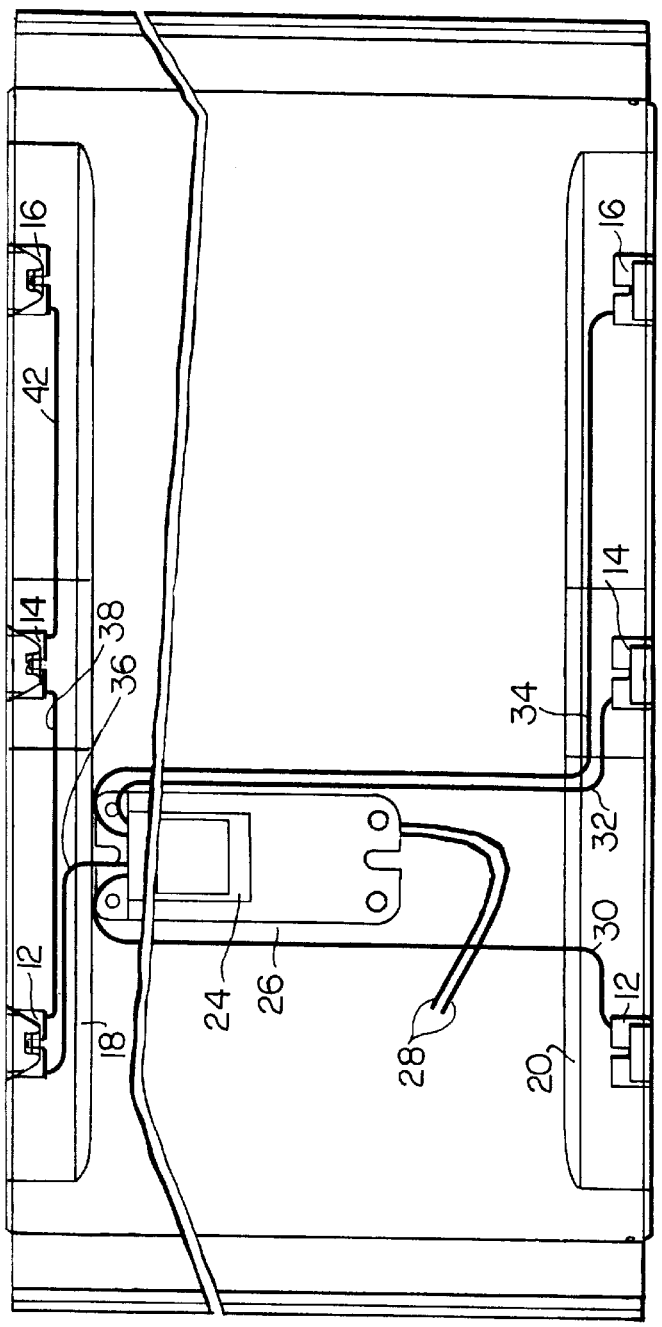
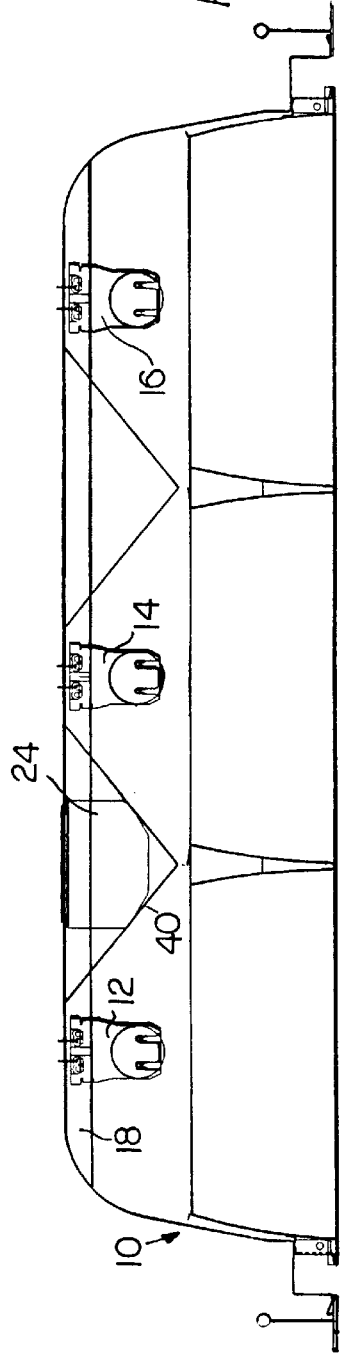
FIG. 1 PRIOR ART
FIG. 2 PRIOR ART

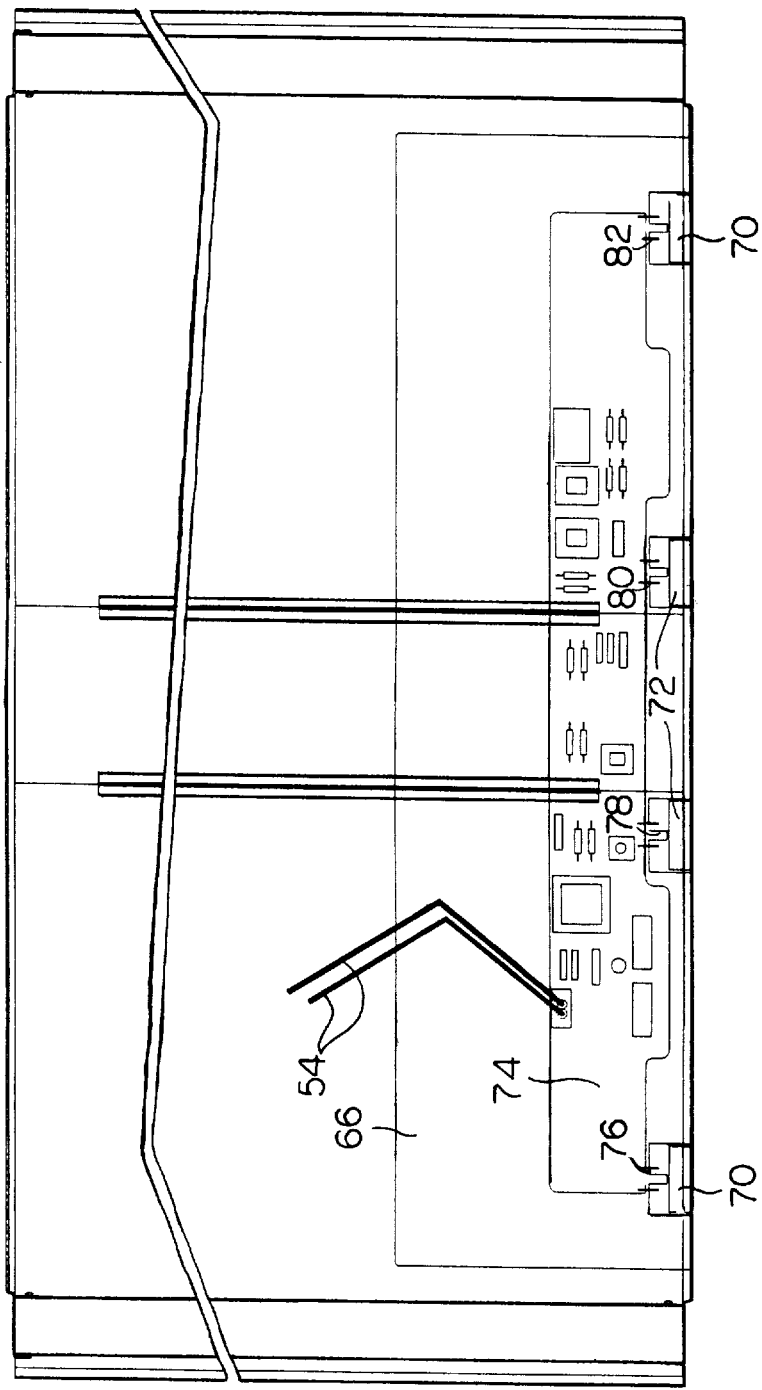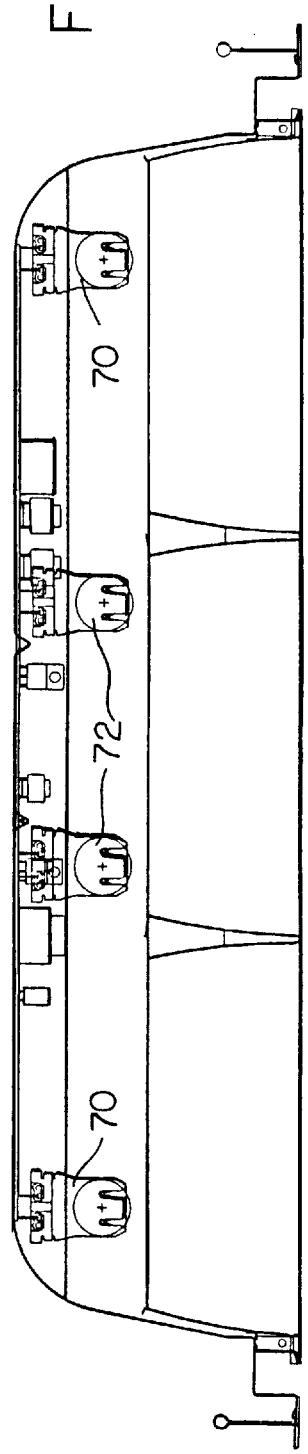

END MOUNT BALLAST- SOCKET BRIDGE

FIELD OF THE INVENTION

The present invention relates generally to fluorescent lighting fixtures, and more particularly to an improved manner of connecting the internal ballast in a fluorescent lighting fixture to the fluorescent lamp holders.

DESCRIPTION OF THE PRIOR ART

The use of fluorescent lighting is widespread in both residential and commercial establishments, primarily because of its low operating costs and the pleasant light it provides. The conventional fluorescent lighting fixture includes a generally rectangular or square housing that includes one or more pairs of lamp holders in which a corresponding number of fluorescent lamps are mounted. An electrical ballast also mounted in the housing controls the amount of current that is supplied to the fluorescent lamps and provides the proper operating voltage to start the lamps.

Two types of ballasts are currently in use in fluorescent lighting fixtures, the electromagnetic and electronic. The electromagnetic ballast includes a transformer and usually a capacitor, whereas the electronic ballast includes a plurality of electrical components mounted on a printed circuit board to establish the requisite circuitry to rectify the incoming 60 cycle a.c. voltage, and then to create a high-frequency voltage, typically above 20 kHz, to operate the fluorescent lamps.

In a conventional fluorescent lighting fixture, the ballast is enclosed in a ballast enclosure that runs the length of the fixture. A plurality of wires extend from the ballast to the lamp holders to supply the operating voltage to the lamps. For example, in an instant-start electronic three-lamp fixture, four long lead wires extend from the ballast to make electrical connection to the lamp holders. The need to run these wires and to plug them into the lampholders adds materially to the time and the cost of assembling the fixture, which, in turn, adds to the cost of the fixture to the consumers.

SUMMARY AND OBJECT OF THE INVENTION

It is an object of the invention to provide a fluorescent lighting fixture which is less expensive and less complex to assemble.

It is a more specific object of the present invention to provide a fluorescent lighting fixture in which a significant amount of the wiring run between the ballast and lampholders in a conventional fluorescent lighting fixture is eliminated.

It is another object of the present invention to provide a fluorescent lighting fixture in which components now used in such fixtures, such as the ballast cover, are combined with other parts or eliminated.

It is yet another object of the present invention to provide a fluorescent lighting fixture of the type described which is more amenable to the use of automated fabrication techniques.

To these ends, the fluorescent lighting fixture of the invention employs an electronic ballast, the elements of which are mounted on a printed circuit board. The output connectors on the board are connected to the lampholders through output pins of the printed circuit board which are mounted directly into the lampholders.

DESCRIPTION OF THE DRAWINGS

To the accomplishment of the above to further objects as may hereinafter appear, the present invention relates to a fluorescent lighting fixture substantially as defined in the appended claims, as considered with the following detailed specification and the accompanying drawings, in which FIG. 1 is a plan view of a conventional fluorescent lighting fixture;

FIG. 2 is an elevation of the fluorescent lighting fixture of FIG. 1;

FIG. 5 is a plan view of a fluorescent lighting fixture in accordance with a second embodiment of the invention; and FIG. 6 is an elevation of the fixture of FIG. 5.

DETAILED DESCRIPTION OF THE PREFERRED EMBODIMENTS

Figure 3:
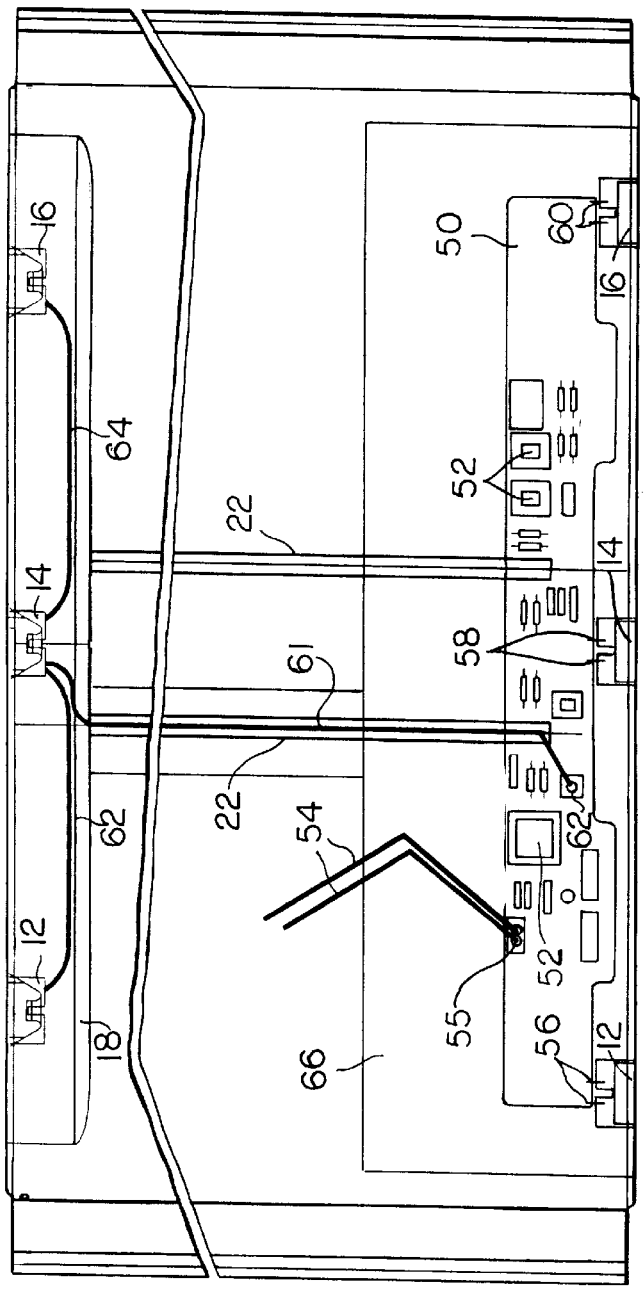
FIG. 3 is a plan view of a fluorescent lighting fixture in accordance with a first embodiment of the invention.

A conventional fluorescent lighting fixture, as illustrated in FIGS. 1 and 2, includes a rectangular fixture housing 10, in which are mounted a plurality, here three, of pairs of axially aligned spaced lamp holders 12, 14 and 16 each of which receives the opposite ends of a conventional fluorescent lamp (not shown). The opposing lampholders in each pair are respectively mounted on a pair of socket bridge covers 18, 20.

Electrical operating voltage and current are supplied to the fluorescent lamps by means of a conventional ballast 24 mounted to the fixture housing by a mounting bracket 26. The ballast 24 receives a supply voltage via feed wires 28. Ballast 24, which may be, as is conventional, in the form of electronic components mounted on a printed circuit board (not shown in FIG. 1) produces the requisite high-voltage supply for the fluorescent lamps on four wires 30, 32, 34, 36. Wires 30, 36 are respectively connected to the lampholders 12, wire 32 is connected to the lampholders 14, and wire 34 is connected to the lampholders 16. To complete the supply of operating voltage and current from the ballast to all the lamps, a jumper wire 38 is run between the lampholders 12 and 14, and another jumper wire 42 is run between the lampholders 14 and 16. As seen in FIG. 2, ballast 24 is enclosed within a ballast wireway cover 40, which extends across substantially the entire length of the fixture. The circuit board or ballast 24 in the conventional fixture is typically covered with an enclosure to limit the radiation of radio-frequency interference.

Figure 4:
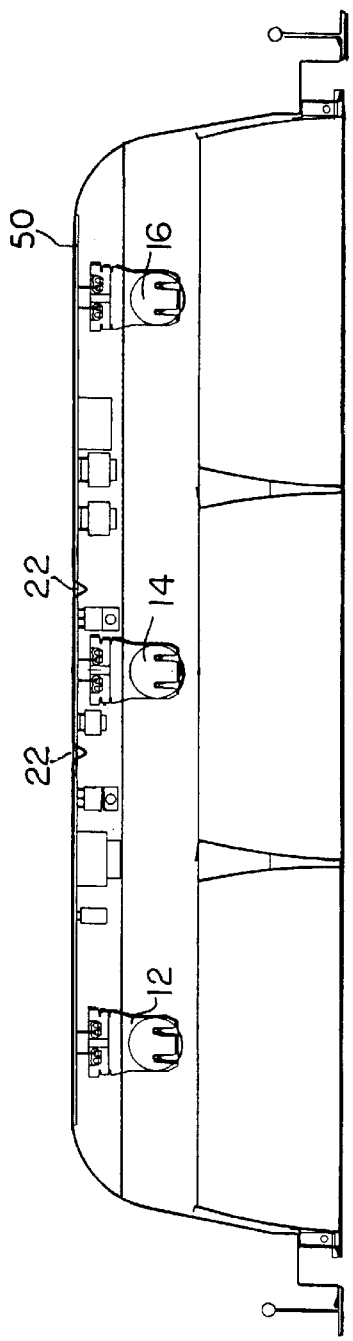
FIG. 4 is an elevation of the fixture of FIG. 3.

The fluorescent lighting fixture of the present invention reduces the number of internal wires required to operate the fixture, and more specifically the number of such internal wires that are run between the ballast and the lamp holders. Thus, the embodiment of the invention illustrated in FIGS. 3 and 4, the number of internal wires needed to operate a three-lamp fixture is reduced from three wires, as in the prior art three-lamp fixture illustrated in FIGS. 1 and 2, to a single wire. As shown in FIG. 3, the ballast is in the form of a printed circuit board 50 on which are mounted a plurality of electronic components 52 that perform the required electrical operations on the input supply a.c. voltage to create at its output the required operating voltage and current for the lamps.

The printed circuit board 50 receives, as in the conventional fixture, the supply voltage via feed wires 54 at a input contact 55. Rather than running wires from the ballast output to the lampholders, as in the conventional fixture of FIG. 1, in the fixture of the present invention the printed circuit board includes pairs of mounting or wiring output pins 56, 58 and 60 that extend from the lower end of board 50.

Output pins 56, 58 and 60 are directly mounted and connected to the lower lampholder in each lampholder pairs 12, 14 and 16, respectively, as seen best in FIG. 3, to supply the operating voltage and wires to the lampholders.

Specifically, a single wire 61 extends from an output pad 62 on printed circuit board 50 to one of the upper lampholders 12, 14 and 16, from which jumper wires 62 and 64 are respectively run for connection to the other upper lampholders. For purposes of example, wire 61 is shown in FIG. 3 extending to upper lampholder 14. In this manner, operating voltage is supplied to the fluorescent lamps through the use of only a single wire that is run to the opposite end of the fixture. The other connections from the ballast to the lampholders are made via the output pins 56, 58 and 60 on the printed circuit board 50, which are directly mounted in and directly connected to the lampholders. The single wire 61 may be run through a rib 22 running the length of the housing. If desired a wiring cover 68 in the form of strips of insulating tape, or other material, may be placed over the rib 22.

Because of the direct mounting of the printed circuit board ballast 50 to the lower lampholder there is no longer a need for the bulky ballast cover or ballast case that is used in the prior art fixture. Instead the ballast 50, as shown in FIG. 3, is enclosed in an enlarged socket bridge 66. The enlarged socket bridge 66, combined with the fixture housing, form an enclosure that captures the radio-frequency interference of the ballast. This eliminates the need for a separate enclosure that is typically provided by the ballast manufacturer.

The embodiment of the invention illustrated in FIGS. 5 an 6 is intended for use with a pair of U-shaped fluorescent lamp (not shown), which extend respectively between two pairs of lampholders 70 and 72. A printed circuit board 74 is similar to that used in the embodiment of FIGS. 3 and 4, except that it includes four pairs of lampholder wiring pins 76, 78, 80 and 82, which are respectively mounted directly in and connected to the lamp holders 70 and 72, as shown in FIG. 5. It will be noted that in this embodiment not even a single wire is run between the printed circuit board and any lampholder or between lampholders. Rather, in this embodiment of the invention, all connections to the lampholders are made by the direct connection of the ballast outputs of the printed circuit board to the lampholders. And, as in the embodiment of FIGS. 3 and 4, in the embodiment of FIGS. 5 and 6, only a single enlarged socket bridge 66 is needed to enclose the ballast.

It will be appreciated that the present invention provides a fluorescent lighting fixture utilizing an electronic ballast in which the need to run internal wires from the ballast to the lampholders is minimized, and even, as in one embodiment, completely eliminated. The present invention also does away with the need for a ballast case while reducing the creation of undesired radio-frequency interference. The fluorescent lighting fixture of the invention is thus less costly to assemble both in components and labor, and lends itself to the automatic insertion and mounting of the ballast and lampholder in the fixture housing. It will also be appreciated that although the invention has been described with reference to two presently preferred embodiments, modifications may be made therein without necessarily departing from the spirit and scope of the invention.

What is claimed is:

1. A fluorescent lighting fixture comprising a housing, at least one pair of spaced lampholders adapted to receive therein the ends of a fluorescent lamp mounted in said housing, a ballast for providing operating voltage and current to said lampholders, said ballast including a printed circuit board having at least one output pin secured to said board, said output pin being directly mounted and electrically connected to said at least one lampholder, and an enlarged socket bridge enclosing said ballast for absorbing radio-frequency radiation from said ballast.

2. The fluorescent lighting fixture of claim 1, in which said lampholders are axially spaced from one another.

3. The fluorescent lighting fixture of claim 2, which comprises a plurality of pairs of axially spaced lampholders, said printed circuit board including a corresponding plurality of output pins directly mounted and electrically connected to one of said lampholders in each of said plurality of lampholder pairs.

4. The fluorescent lighting fixture of claim 1, in which said pair of lampholders is arranged on one side of said housing, said printed circuit board output pins being directly mounted and electrically connected in each of said lampholders.

5. The fluorescent lighting fixture of claim 1, wherein said housing encloses said ballast.

\* \* \* \* \*